United States Patent
Dauch et al.

(10) Patent No.: US 7,253,092 B2
(45) Date of Patent: Aug. 7, 2007

(54) TUNGSTEN PLUG CORROSION PREVENTION METHOD USING WATER

(75) Inventors: Elizabeth A. Dauch, Rocklin, CA (US); John W. Jacobs, Granite Bay, CA (US)

(73) Assignee: NEC Electronics America, Inc., Santa Clara, CA (US)

( * ) Notice: Subject to any disclaimer, the term of this patent is extended or adjusted under 35 U.S.C. 154(b) by 0 days.

(21) Appl. No.: 10/602,291

(22) Filed: Jun. 24, 2003

(65) Prior Publication Data

US 2004/0266180 A1 Dec. 30, 2004

(51) Int. Cl.
*H01L 21/4763* (2006.01)
*H01L 21/44* (2006.01)

(52) U.S. Cl. .................. 438/618; 438/622; 438/624; 438/625; 438/627; 438/629; 438/642; 438/643; 438/648; 438/652; 438/653; 438/656; 438/669; 438/670; 438/671; 438/672; 438/675; 438/677; 438/685; 257/E21.168; 257/E21.185; 257/E21.187; 257/E21.189; 257/E21.218

(58) Field of Classification Search .......... 438/618, 438/622, 624–625, 627, 629, 642–643, 648, 438/652–653, 656, 669, 670–672, 675, 677, 438/685, 692–693
See application file for complete search history.

(56) References Cited

U.S. PATENT DOCUMENTS

| | | | |
|---|---|---|---|
| 4,901,194 A | 2/1990 | Steinman et al. ........... 361/213 |
| 5,336,371 A | 8/1994 | Chung et al. ............. 156/659.1 |
| 5,476,816 A * | 12/1995 | Mautz et al. ............... 438/622 |
| 6,012,469 A * | 1/2000 | Li et al. ..................... 438/704 |
| 6,077,762 A | 6/2000 | Liang et al. ................ 438/593 |
| 6,153,531 A | 11/2000 | Bothra et al. .............. 438/745 |
| 6,277,742 B1 * | 8/2001 | Wang et al. ................ 438/672 |
| 6,284,055 B1 | 9/2001 | Dryer et al. .................. 134/10 |
| 6,358,329 B1 * | 3/2002 | Muranaka et al. ........... 134/26 |
| 6,358,835 B1 | 3/2002 | Kanamura .................. 438/618 |
| 6,410,417 B1 * | 6/2002 | Tsai et al. ................... 438/618 |
| 6,507,474 B1 | 1/2003 | Singh et al. ................ 361/230 |
| 6,703,301 B2 | 3/2004 | Tai et al. .................... 438/620 |
| 6,851,873 B2 | 2/2005 | Muraoka et al. ............ 396/611 |
| 6,872,669 B1 | 3/2005 | Summerfelt et al. ........ 438/712 |
| 2002/0036001 A1 | 3/2002 | Ise et al. ..................... 134/1.3 |
| 2002/0053355 A1 | 5/2002 | Kamikawa et al. ........... 134/30 |
| 2003/0006513 A1 | 1/2003 | Gotoh et al. ............. 261/122.1 |

* cited by examiner

*Primary Examiner*—Michael Lebentritt
*Assistant Examiner*—Mohsen Ahmadi
(74) *Attorney, Agent, or Firm*—Campbell Stephenson Ascolese LLP

(57) ABSTRACT

Disclosed herein is a method of making integrated circuits. In one embodiment the method includes forming tungsten plugs in the integrated circuit and forming electrically conductive interconnect lines in the integrated circuit after formation of the tungsten plugs. At least one tungsten plug is electrically connected to at least one electrically conductive interconnect line. Thereafter at least one electrically conductive interconnect line is contacted with water for a period of time less than 120 minutes.

20 Claims, 5 Drawing Sheets

TUNGSTEN PLUG CORROSION PREVENTION METHOD USING WATER

BACKGROUND OF THE INVENTION

Interconnect lines electrically connect devices within an integrated circuit (IC). IC devices may include one or more complimentary metal oxide semiconductor (CMOS) transistors having diffused source and drain regions separated by channel regions, and gates that are located over the channel regions. In practice, an IC may include thousands or millions of devices, such as CMOS transistors.

Interconnect lines of ICs generally take the form of patterned metallization layers. Interconnect lines may be formed one on top of another with an electrically insulating material therebetween. As will be more fully described below, one interconnect line may be formed under another interconnect line and electrically connected thereto by one or more tungsten plugs.

ICs are manufactured on silicon substrates using conventional photolithographic techniques. FIGS. 1-8 show a cross-sectional view of an IC during a portion of its manufacture. More particularly, FIG. 1 shows a first dielectric layer 12, a first metallization layer 14, and a photoresist layer 16 formed over substrate 10. Layers 12-16 are formed using conventional techniques such as chemical vapor deposition, sputtering, or spin-on coating.

First metallization layer 14 can be formed into a first interconnect line. This first interconnect line can be formed by selectively exposing photoresist layer 16 to light passing through a patterned reticle (not shown). Photoresist areas of layer 16 exposed to light are subsequently removed using conventional development techniques. FIG. 2 shows the substrate 10 of FIG. 1 after development of photoresist layer 16 to form photoresist mask pattern 20.

Once the photoresist mask pattern 20 is formed, a plasma etching operation is applied to the IC shown in FIG. 2 to remove portions of metallization layer 14 that are not covered by photoresist mask pattern 20. FIG. 3 shows the IC of FIG. 2 after plasma etching thereof. The plasma etching operation results in first interconnect line 22.

FIG. 4 shows the IC of FIG. 3 after a second dielectric layer 24 is deposited thereon. Although not shown, photoresist mask pattern 20 is removed prior to formation of second dielectric layer 24. The second dielectric layer 24 and the first dielectric layer 12 may be formed from an insulating material such as silicon dioxide.

FIG. 5 shows the IC of FIG. 4 after a via 26 is formed within the second dielectric layer 24. As is well known in the art, vias, such as via 26, are formed by depositing a photoresist layer (not shown) over dielectric layer 24, selectively exposing this photoresist layer to light passing through a patterned reticle having via hole patterns formed therein, developing and removing the exposed photoresist to form a photoresist via mask pattern, etching any dielectric layer 24 exposed through the photoresist via mask pattern, and removing the remaining photoresist via mask after etching dielectric layer 24.

Once the vias are formed within the second dielectric layer 24, the vias are filled with an electrically conductive material such as tungsten. As well is known in the art, vias, such as via 26, are filled by depositing a barrier film by sputter or chemical vapor deposition, depositing a conductive film by sputter or chemical vapor deposition, and then removing the conductive film, and possibly removing the barrier film, over dielectric layer 24, but not inside the via 26. The barrier film is typically comprised of titanium, titanium nitride, or a titanium/titanium nitride stack. The conductive film is typically tungsten. The conductive film, and possibly the barrier film, is removed by plasma etching, chemical mechanical polishing, or wet etching. FIG. 6 shows via 26 of FIG. 5 filled with tungsten, thereby forming tungsten plug 30.

After the tungsten plugs are formed, a second metallization layer is formed over dielectric layer 24 and the tungsten plugs, including tungsten plug 30. This metallization layer is typically comprised of a metal stack that includes any combination of one or more the following: titanium, titanium nitride, aluminum, an aluminum copper alloy, or an aluminum silicon copper alloy. This metallization layer is then patterned using conventional photolithography and plasma etching to form an additional layer of interconnect lines. FIG. 7 shows the IC of FIG. 6 with a second interconnect line 32 formed thereon. The second interconnect line 32 is electrically coupled to the first interconnect line 22 via the tungsten plug 30. First interconnect line 22 may be coupled at one end to a first device (i.e., a first CMOS transistor). The second interconnect line 32 may be coupled to a second device (i.e., a second CMOS transistor) or coupled to connections which lead to the outside of the chip package. Accordingly, the structure of the first interconnect line 22, tungsten plug 30, and second interconnect line 32, function to interconnect the first and second IC devices or function to interconnect an IC device and external package connections.

As is well known in the art, conventional plasma etching to form interconnect lines (e.g., interconnect line 32) often leaves residual polymer (not shown) on the sides of the interconnect lines. To remove this residual polymer on the sides of the interconnect lines, a liquid cleaning solution is often used after plasma etch. Further, conventional plasma etching to form interconnect line 32 may leave a positive electrical charge interconnect line 32, and thus, tungsten plug 30 and first interconnect line 22. For purposes of explanation, it will be presumed that the structure consisting of first interconnect line 22, tungsten plug 30, and second interconnect line 32 is a floating structure such that both interconnect lines 22 and 30 and tungsten plug 30 will be positively charged before the polymer residue removal process.

After plasma etching, the IC shown in FIG. 7 is exposed to a cleaning solution to remove any polymer remaining after the plasma etching step. Typically this cleaning solution may be alkaline or basic in nature (i.e. pH is greater than 7), however, acidic solutions (i.e. pH is less than 7) can also be used. Although the cleaning solution works well in removing polymer residues, one, some, or all of the tungsten plugs that are exposed to the cleaning solution may dissolve or erode away during the polymer residue removal process. The cause is electrochemical corrosion caused by two dissimilar conductive materials being in contact, the interconnect line and the tungsten plug, while both conductive materials are simultaneously in contact with an electrolyte, the cleaning solution or rinsing solution, during the polymer removal process.

More and more devices are packed into smaller ICs. As such, the density of devices and interconnect lines in ICs has dramatically increased over the years. Unfortunately, this dense integration of devices and interconnect lines has the effect of pushing the limits of conventional photolithography patterning, which necessarily makes photolithography masks misalignments more likely to occur. An increase in misalignments will result in an increase of exposed tungsten plugs.

FIG. 7 illustrates the effects of misalignment of photolithography masks. More particularly, the misalignment of photolithography masks used to create second interconnect line 32 produces a misalignment of second interconnect line 32 with respect to tungsten plug 30. As a result of this misalignment, tungsten plug 30 will be exposed to cleaning solution during the polymer residue removal step described above.

FIG. 8 illustrates how tungsten plug 30 could be corroded by the cleaning solution of the polymer residue removal process. As seen in FIG. 8, a substantial portion of tungsten plug 30, is removed by the aforementioned corrosion. Tungsten plug corrosion may have adverse effects on performance of the IC. For example, corrosion of tungsten plug 30 shown in FIG. 8 may be so extensive that first interconnect line 22 is no longer electrically coupled to second interconnect line 32 thereby creating an open circuit therebetween. IC devices coupled to second interconnect line 32 could be electrically isolated from IC devices coupled to first interconnect line 22 thereby resulting in an IC that fails to function for its intended purpose.

Clearly, there is a need to avoid tungsten plug corrosion in the manufacture of ICs. In 1998, a paper was published by S. Bothra, H. Sur, and V. Liang, entitled, "A New Failure Mechanism by Corrosion of Tungsten in a Tungsten Plug Process," IEEE Annual International Reliability Physics Symposium, pages 150-156. This paper, which is incorporated herein by reference in its entirety, describes some techniques for preventing tungsten plug corrosion. These techniques involve discharging the tungsten plugs prior to immersion in alkaline cleaning solution to remove polymer residue. In one technique described in the paper, tungsten plug discharge is accomplished by dipping ICs in an ionic solution prior to polymer residue removal. The paper describes that this ionic solution should have a pH near neutral (e.g. pH near 7). The paper describes deionized (DI) water as one form of ionic solution for discharging tungsten plugs. However, the paper found that a relatively long emersion time of several hours within the DI water was necessary to discharge exposed tungsten plugs, such as the exposed tungsten plug shown in FIG. 7. The exposed tungsten plugs were found to remain in tact after subsequent emersion in the alkaline cleaning solution; however, noticeable corrosion of the interconnect lines, such as interconnect line 32, was observed. Accordingly, this paper concluded that emersion in DI water of ICs for the purpose of discharging exposed tungsten plugs, was not a "practical" approach. It is noted that this paper should not be considered prior art to the invention claimed herein.

U.S. Pat. No. 6,277,742 describes another technique for preventing tungsten plug corrosion. In U.S. Pat. No. 6,277,742, an IC is dipped into an electrolyte solution sufficiently acid or alkaline. According to U.S. Pat. No. 6,277,742, charges accumulated can be discharged by dipping the IC into the electrolyte solution. Preferably, when an acid electrolyte solution is used, the pH value of the acid electrolyte solution is said to be less than 6.5. The acid electrolyte solution is said to include an oxy-acid aqueous solution such as acetic acid ($CH_3COOH$), sulfuric acid ($H_2SO_4$) or nitric acid ($HNO_3$). The acid electrolytic solution is said to include a hydrohalic acid like hydrofluoric acid (HF) or hydrochloric acid (HCl). An acid salt aqueous solution, for example, sodium hydrogen sulfate ($NaHSO_4$), ammonium chloride ($NH_4Cl$) or ammonium nitride ($NH_4NO_3$) is also said to be suitable. Preferably, when an alkaline electrolyte solution is used, the pH value of the alkaline electrolyte solution is greater than 7.5. The alkaline electrolyte solution is said to include either ammonium hydroxide ($NH_4OH$) aqueous solution or metal hydroxide ($M(OH)_x$) aqueous solution. The metal hydroxide aqueous solution includes sodium hydroxide (NaOH) or potassium hydroxide (KOH). An alkaline salt aqueous solution, for example, sodium acetate ($CH_3COONa$) or sodium carbonate ($Na_2CO_3$) is also said to be suitable. It is noted alkaline or acidic electrolytic solution may be environmentally hazardous or hazardous to those who are responsible for discharging ICs prior to polymer residue removal.

SUMMARY OF THE INVENTION

Disclosed herein is a method of making integrated circuits. In one embodiment the method includes forming tungsten plugs in the integrated circuit and forming electrically conductive interconnect lines in the integrated circuit after formation of the tungsten plugs. At least one tungsten plug is electrically connected to at least one electrically conductive interconnect line. Thereafter at least one electrically conductive interconnect line is contacted with water for a period of time less than 120 minutes.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

Figure 1:
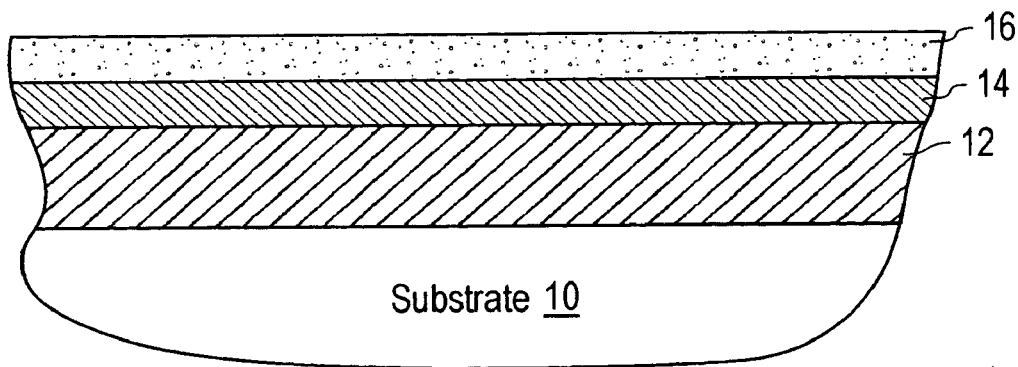
FIG. 1 is a cross-sectional view of a portion of a partially fabricated integrated circuit.
Figure 2:
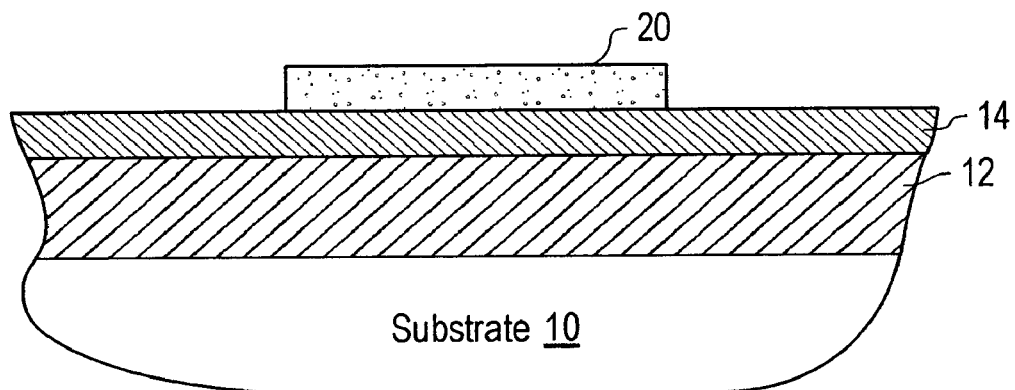
FIG. 2 shows the IC of FIG. 1 after patterning the photoresist layer to form photoresist mask pattern.
Figure 3:
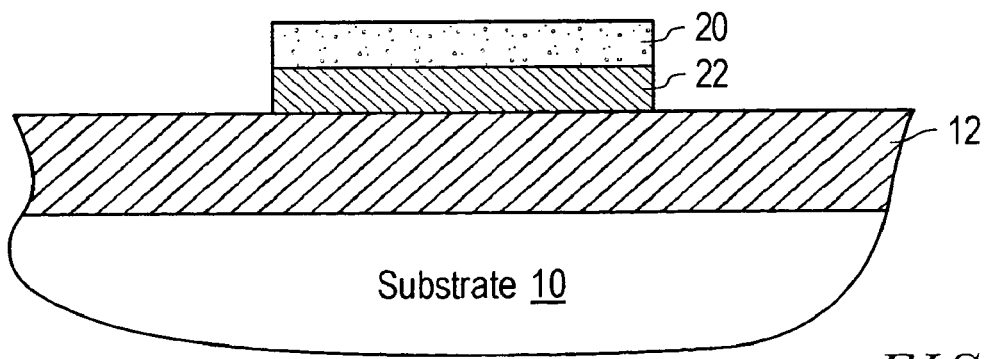
FIG. 3 shows the IC of FIG. 2 after etching the first metallization layer.
Figure 4:
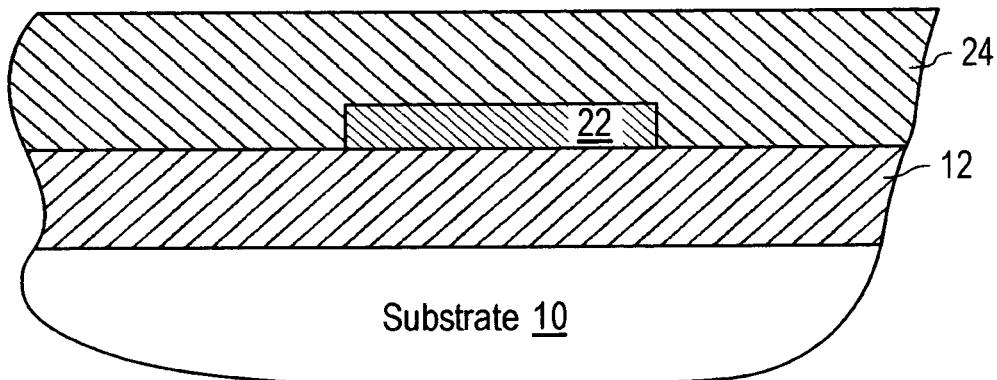
FIG. 4 illustrates the IC of FIG. 3 with a second dielectric layer formed thereon.
Figure 5:
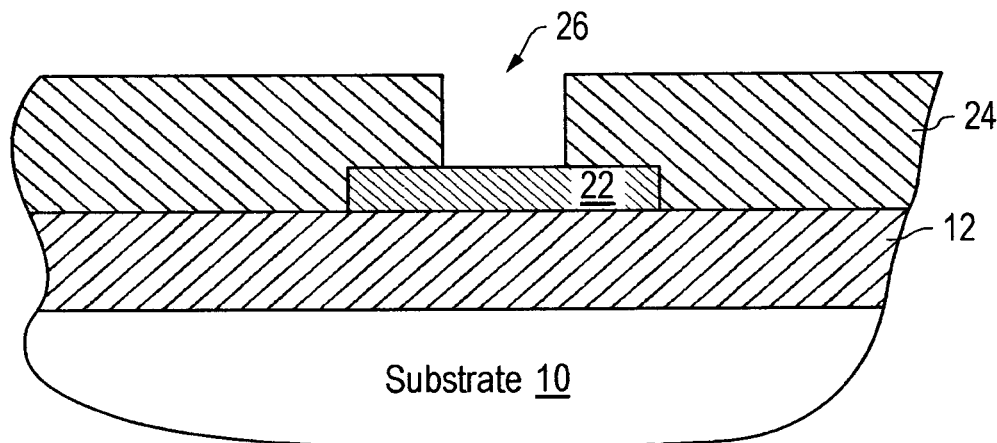
FIG. 5 illustrates the IC of FIG. 4 after formation of a via within the second dielectric layer.
Figure 6:
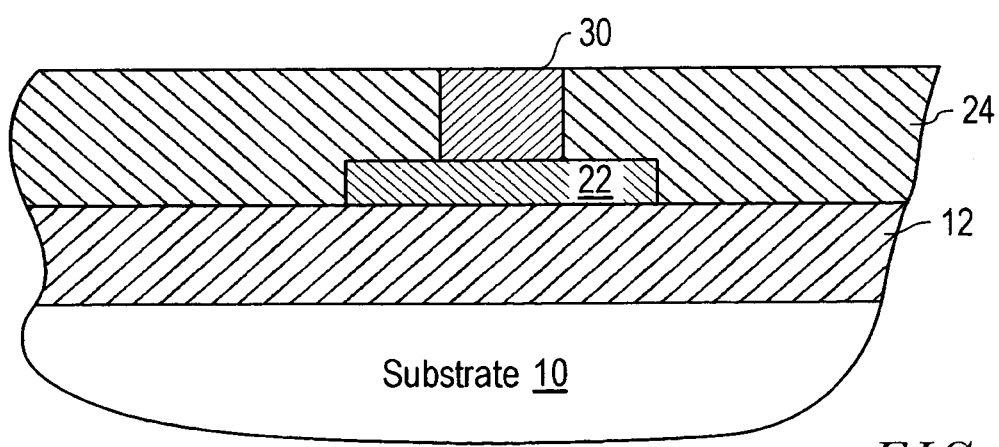
FIG. 6 shows the IC of FIG. 5 with a tungsten plug formed therein.
Figure 7:
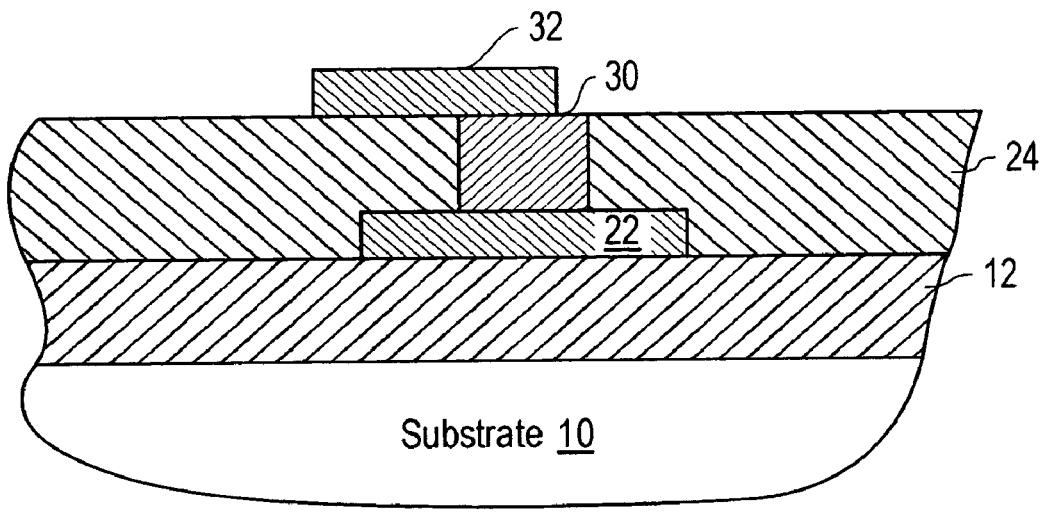
FIG. 7 shows the IC of FIG. 6 after formation of a second interconnect line thereon.
Figure 8:
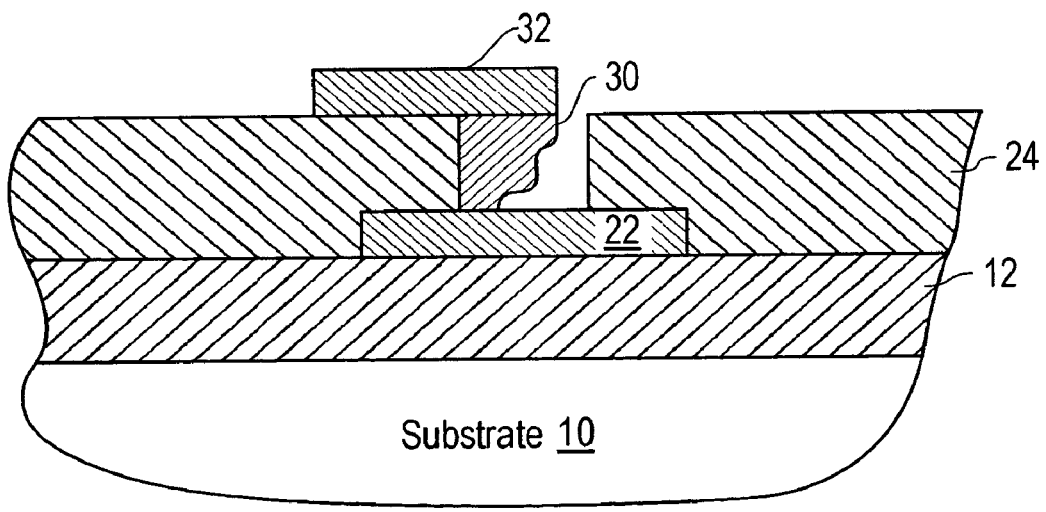
FIG. 8 shows the IC of FIG. 7 after exposure to a cleaning solution to remove polymer residue.

The present invention relates to a method of making ICs. In one embodiment the method includes forming a tungsten plug in a dielectric layer and forming an electrically conductive interconnect line partially or completely covering the tungsten plug after formation of the tungsten plug. FIG. 7 illustrates an exemplary, partially formed IC in which interconnect line 32 is formed after formation of dielectric layer 24 and tungsten plug 30. The electrically conductive interconnect line 32 in FIG. 7, may be formed from conductive materials such as a metal stack comprised of any combination of one or more of the following: titanium, titanium nitride, aluminum, an aluminum copper alloy, or an aluminum silicon copper alloy. The Tungsten plug 30 is electrically connected to conductive interconnect line 32.

Formation of conductive line 32 may result in an unwanted polymer residue as described above. Moreover, formation of conductive line 32 may result in the accumulation of electrical charge on the conductive line 32 and the tungsten plug 30 connected thereto and the underlying conductive line 22 connected to tungsten plug 30. The polymer residue may be removed by a step of exposing the partially formed IC of FIG. 7 to a cleaning solution. Before the polymer residue removal step, but after the formation of the conductive interconnect line 32, the partially formed IC is brought in contact with water for a period of time less than 120 minutes. More particularly interconnect line 32 connected to tungsten plug 30 (and tungsten plug 30 if not covered by interconnect 32), is contacted with water for a period of time less than 120 minutes. In one embodiment, contact is effected by dipping the partially formed IC into a bath of water. In another embodiment, the water is sprayed on the IC. In another embodiment, the water is dispensed on the IC by a nozzle. In a preferred embodiment, interconnect line 32 is contacted with water for a period of time equal to or less than 15 minutes.

The contact with the water fully or partially discharges conductive interconnect line 32 and tungsten plug 30 connected thereto and the underlying conductive line 22 connected to tungsten plug 30. It is noted that ICs may be created with more than two levels of interconnect lines. Interconnect lines 22 and 32 in FIG. 7 are lines in two separate levels. Ideally, each time a level of interconnect lines is formed, the newly formed interconnect lines should be contacted with water.

The water used to discharge conductive interconnect line 32 and/or tungsten plug 30 connected thereto and/or the underlying conductive line 22 connected to tungsten plug 30, may have a pH at neutral or 7. It is noted that the pH of the water may be slightly higher or lower than neutral. In one embodiment, the water used is degasified. Degasified water can be formed during a distillation and/or filtration process in which as much of the dissolved gases (i.e., nitrogen, oxygen, carbon dioxide, etc.) and microbubbles as possible are removed from water. In another embodiment, water that is not degasified and which has a pH at or near neutral, is used to discharge conductive interconnect line 32 and tungsten plug 30 connected thereto and the underlying conductive line 22 connected to tungsten plug 30. The water used to discharge conductive interconnect line 32 and tungsten plug 30 connected thereto and the underlying conductive line 22 connected to tungsten plug 30 may be deionized (DI) water. DI water is water which has been "deionized" or has "no ions." In a deionization process, water goes through an ion-exchange and/or reverse osmosis process in order to remove ions dissolved in the water (i.e. calcium, potassium, chlorine, fluorine, etc.) or other ionic impurities. This process may make the water purer and may control pH. In actuality, DI water still has ions because at all temperatures above absolute zero, water thermally dissociates into hydroxide ions and hydrogen ions (protons). In another embodiment, non-DI water is used to discharge conductive interconnect line 32 and tungsten plug 30 connected thereto and the underlying conductive line 22 connected to tungsten plug 30. In yet other embodiments, the water used to discharge conductive interconnect line 32 and tungsten plug 30 connected thereto and the underlying conductive line 22 connected to tungsten plug 30 may be: degasified and deionized; deionized but not degasified; degasified but not deionized; or neither degasified nor deionized.

Figure 9:
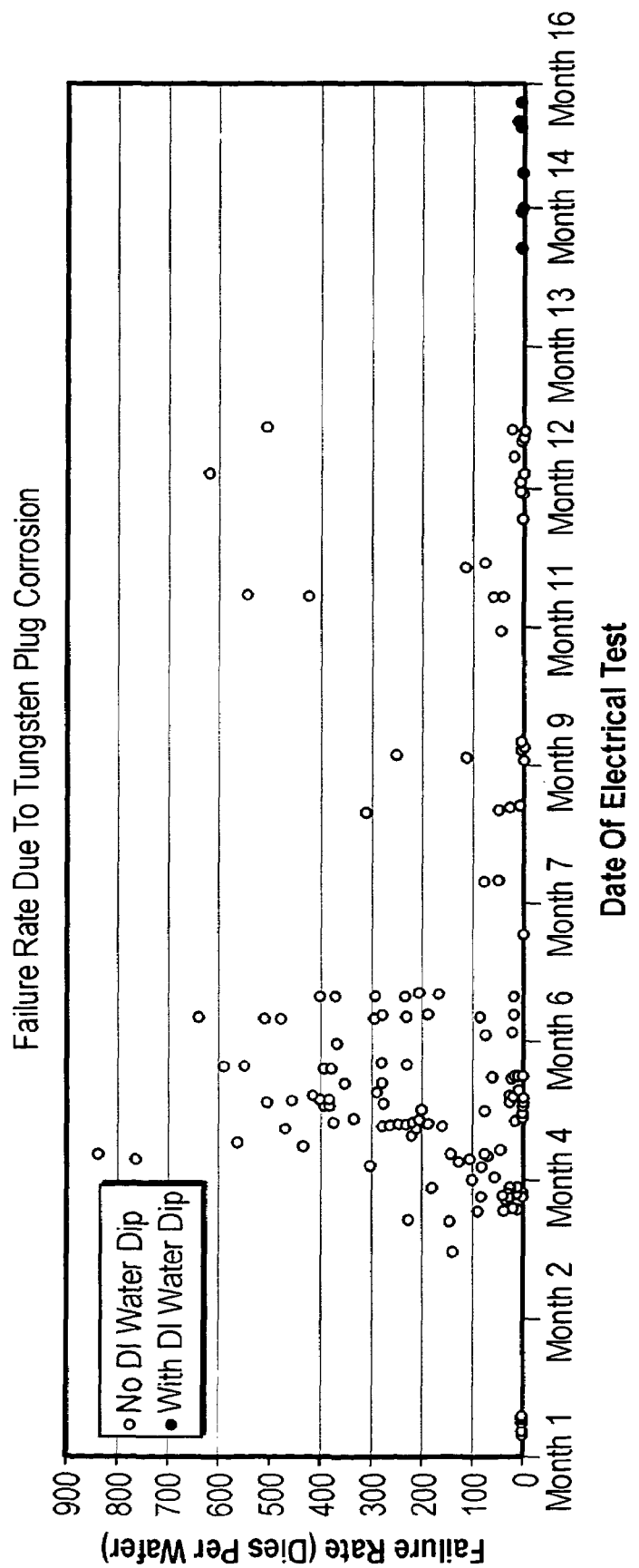
FIG. 9 is a graph showing test results of an IC manufactured with and without use of one embodiment of the present invention to discharge tungsten plugs.
Figure 10:
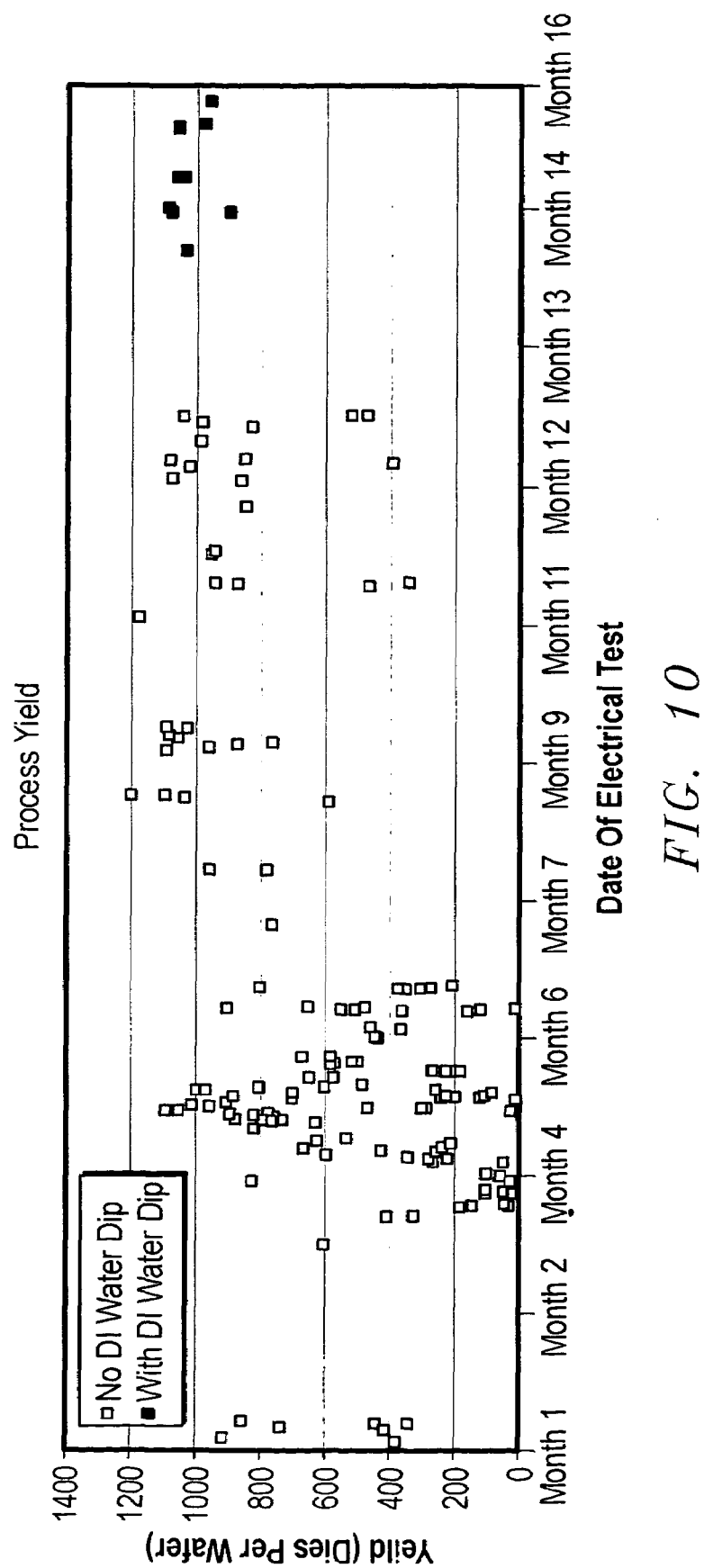
FIG. 10 is another graph showing test results of an IC manufactured with and without use of one embodiment of the present invention to discharge tungsten plugs.

FIGS. 9 and 10 graph the results of testing ICs during a 16 month period. The tested ICs are identical in design and were made with and without the step of dipping the ICs into a DI water bath for 120 minutes or less prior to exposure to an alkaline cleaning solution to remove polymer residue. ICs tested after month 13 were made using a 120 minute or less DI water-dip prior to polymer residue removal in accordance with one embodiment of the present invention, while ICs tested before month 13 were not made with the process step of dipping into DI water for 120 minutes or less prior to polymer residue removal. Except for the DI water dip step, the ICs tested were made using identical manufacturing tools and processes.

FIG. 9 shows that ICs (dies) made with the DI water dip step on average were less prone to failure as a result of tungsten plug corrosion when compared to ICs made without the DI water dip step. FIG. 10 shows that on average, the process yield (ICs that functioned properly versus ICs that failed to function properly) is higher when the DI water dip is used in the manufacturing process.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
    forming a tungsten plug in a dielectric layer;
    forming an electrically conductive interconnect line on the dielectric layer after formation of the tungsten plug, wherein the tungsten plug is electrically connected to the electrically conductive interconnect line;
    contacting the electrically conductive interconnect line with liquid water after formation of the electrically conductive interconnect line;
    contacting the electrically conductive interconnect line with a solution to remove residual polymer after the electrically conductive interconnect line is contacted with the liquid water;
    wherein the electrically conductive interconnect line is contacted with the liquid water for less than 120 minutes.

2. The method of claim 1 wherein the liquid water is degasified and deionized.

3. The method of claim 1 wherein the liquid water is deionized but not degasified.

4. The method of claim 1 wherein the liquid water is degasified but not deionized.

5. The method of claim 1 wherein the liquid water is neither degasified nor deionized.

6. The method of claim 1 wherein the liquid water has a pH that is at or near neutral.

7. The method of claim 1 wherein the electrically conductive interconnect line is contacted with the liquid water for less than 60 minutes.

8. The method of claim 1 wherein the electrically conductive interconnect line is contacted with the liquid water for less than 15 minutes.

9. The method of claim 1 wherein the electrically conductive interconnect line is formed from a metal stack that includes one or more of titanium, titanium nitride, aluminum, an aluminum copper alloy, and an aluminum silicon copper alloy.

10. A method comprising:
forming a tungsten plug in a dielectric layer;
forming an electrically conductive interconnect line on the dielectric layer after formation of the tungsten plug, wherein the tungsten plug is electrically connected to the electrically conductive interconnect line;
contacting the electrically conductive interconnect line with liquid water having a pH slightly less than neutral after formation of the electrically conductive interconnect line;
contacting the electrically conductive interconnect line with a solution to remove residual polymer after the electrically conductive interconnect line is contacted with the liquid water;
wherein the electrically conductive interconnect line is contacted with the liquid water for less than 120 minutes.

11. The method of claim 10 wherein the liquid water is degasified and deionized.

12. The method of claim 10 wherein the liquid water is deionized but not degasified.

13. The method of claim 10 wherein the liquid water is degasified but not deionized.

14. The method of claim 10 wherein the liquid water is neither degasified nor deionized.

15. A method comprising:
forming a tungsten plug in a dielectric layer;
forming an electrically conductive interconnect line on the dielectric layer after formation of the tungsten plug, wherein the tungsten plug is electrically connected to the electrically conductive interconnect line;
contacting the electrically conductive interconnect line with liquid water after formation of the electrically conductive interconnect line;
contacting the electrically conductive interconnect line with a solution to remove residual polymer on the electrically conductive interconnect line after the electrically conductive interconnect line is contacted with the liquid water;
wherein the electrically conductive interconnect line is contacted with the liquid water for less than 120 minutes.

16. The method of claim 15 wherein the liquid water is degasified and deionized.

17. The method of claim 15 wherein the liquid water is deionized but not degasified.

18. The method of claim 15 wherein the liquid water is degasified but not deionized.

19. The method of claim 15 wherein the liquid water is neither degasified nor deionized.

20. The method of claim 15 wherein the liquid water has a pH that is at or near neutral.

* * * * *

UNITED STATES PATENT AND TRADEMARK OFFICE
CERTIFICATE OF CORRECTION

| | | |
|---|---|---|
| PATENT NO. | : 7,253,092 B2 | Page 1 of 1 |
| APPLICATION NO. | : 10/602291 | |
| DATED | : August 7, 2007 | |
| INVENTOR(S) | : John W. Jacobs | |

It is certified that error appears in the above-identified patent and that said Letters Patent is hereby corrected as shown below:

Title page, item [75] inventorship should read

--(75)   Inventors:  John W. Jacobs, Granite Bay, CA (US)--

Signed and Sealed this

Twentieth Day of November, 2007

JON W. DUDAS
*Director of the United States Patent and Trademark Office*